(12) United States Patent
Choi et al.

(10) Patent No.: US 11,757,074 B2
(45) Date of Patent: Sep. 12, 2023

(54) LIGHT-EMITTING DIODE DISPLAY PIXELS WITH MICROLENS STACKS OVER LIGHT-EMITTING DIODES

(71) Applicant: Apple Inc., Cupertino, CA (US)

(72) Inventors: Jaein Choi, San Jose, CA (US); Joy M. Johnson, San Francisco, CA (US); Lai Wang, Fremont, CA (US); Ben-Li Sheu, Sunnyvale, CA (US); Hairong Tang, Los Gatos, CA (US); Steven E. Molesa, San Jose, CA (US); Sunggu Kang, San Jose, CA (US); Young Cheol Yang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 316 days.

(21) Appl. No.: 17/225,796

(22) Filed: Apr. 8, 2021

(65) Prior Publication Data

US 2021/0391513 A1    Dec. 16, 2021

Related U.S. Application Data

(60) Provisional application No. 63/038,318, filed on Jun. 12, 2020.

(51) Int. Cl.
*H01L 33/58* (2010.01)
*H10K 50/854* (2023.01)
(Continued)

(52) U.S. Cl.
CPC .......... *H01L 33/58* (2013.01); *H10K 50/854* (2023.02); *H10K 50/858* (2023.02); *H10K 50/865* (2023.02); *H01L 2933/0091* (2013.01)

(58) Field of Classification Search
CPC . H01L 33/58; H01L 2933/0091; H01L 33/44; H10K 50/854; H10K 50/858;
(Continued)

(56) References Cited

U.S. PATENT DOCUMENTS

| 7,023,022 B2 | 4/2006 | Eliashevich et al. |
| 7,535,646 B2 | 5/2009 | Chari et al. |

(Continued)

FOREIGN PATENT DOCUMENTS

| CN | 108011011 A | * 5/2018 | ............. H01L 33/48 |
| CN | 108011011 A | 5/2018 | |

*Primary Examiner* — S M Sohel Imtiaz
(74) *Attorney, Agent, or Firm* — TREYZ LAW GROUP, P.C.; Joseph F. Guihan (57) ABSTRACT

To extract light from a light-emitting diode (and thereby improve efficiency of the display), a microlens stack may be formed over the light-emitting diode. The microlens stack may include an array of microlenses that is covered by an additional single microlens. Having stacked microlenses in this way increases lens power without increasing the thickness of the display. The array of microlenses may be formed from an inorganic material whereas the additional single microlens may be formed from an organic material. The additional single microlens may conform to the upper surfaces of the array of microlenses. An additional low-index layer may be interposed between the light-emitting diode and the array of microlenses. A diffusive layer may be formed around the light-emitting diode to capture light emitted from the light-emitting diode sidewalls.

21 Claims, 10 Drawing Sheets

(51) Int. Cl.
*H10K 50/858* (2023.01)
*H10K 50/86* (2023.01)

(58) Field of Classification Search
CPC .. H10K 50/865; G02B 3/0056; G02B 3/0062; G02B 19/0014; G02B 19/0061
See application file for complete search history.

(56) References Cited

U.S. PATENT DOCUMENTS

| | | |
|---|---|---|
| 7,703,942 B2 | 4/2010 | Narendran et al. |
| 7,932,534 B2 | 4/2011 | Singh et al. |
| 8,076,667 B2 | 12/2011 | Tansu et al. |
| 9,052,096 B2 | 6/2015 | Nishimura et al. |
| 9,876,151 B2 | 1/2018 | Seo et al. |
| 2003/0207484 A1* | 11/2003 | Nishikawa ............ G02B 3/0031 438/31 |
| 2011/0089447 A1* | 4/2011 | Kuo ........................ H01L 33/44 438/33 |
| 2012/0097991 A1* | 4/2012 | Ikeda .................... H10K 50/858 257/E33.073 |
| 2013/0214245 A1 | 8/2013 | Chang et al. |
| 2014/0008676 A1* | 1/2014 | Wang ..................... H10K 50/85 257/98 |
| 2015/0001470 A1* | 1/2015 | Ma ......................... H10K 71/00 257/40 |
| 2015/0333237 A1* | 11/2015 | Facer ..................... H01L 33/44 257/40 |
| 2016/0079479 A1* | 3/2016 | Yamana ............... H10K 50/858 257/98 |
| 2021/0096283 A1* | 4/2021 | Li ....................... H01L 33/0095 |
| 2021/0173208 A1* | 6/2021 | Nakamura ............ G02B 3/0037 |

* cited by examiner

LIGHT-EMITTING DIODE DISPLAY PIXELS WITH MICROLENS STACKS OVER LIGHT-EMITTING DIODES

This application claims the benefit of provisional patent application No. 63/038,318, filed Jun. 12, 2020, which is hereby incorporated by reference herein in its entirety.

BACKGROUND

This relates generally to electronic devices, and, more particularly, to electronic devices with displays.

Electronic devices often include displays. For example, an electronic device may have a light-emitting diode (LED) display based on light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode. To emit light from a given pixel in an light-emitting diode display, a voltage may be applied to the anode of the given pixel.

It is within this context that the embodiments herein arise.

SUMMARY

An electronic device may have a display that an includes an array of light-emitting diodes. Each light-emitting diode may be mounted on a substrate and may include an anode and a cathode.

To extract light from the light-emitting diode (and thereby improve efficiency of the display), a microlens stack may be formed over the light-emitting diode. The microlens stack may include an array of microlenses that is covered by an additional single microlens. Having stacked microlenses in this way increases lens power without increasing the thickness of the display.

The array of microlenses may be formed from an inorganic material having a high index of refraction such as 2.0. The additional single microlens may be formed from an organic material having an index of refraction lower than that of the array of microlenses (e.g., 1.7). The additional single microlens may conform to the upper surfaces of the array of microlenses.

An additional low-index layer may be interposed between the light-emitting diode and the array of microlenses. The low-index layer may increase the lens power of the microlens stack and may improve recycling efficiency for the display. A low-index overcoat may be formed over the microlens stack. A diffusive layer may be formed around the light-emitting diode to capture light emitted from the light-emitting diode sidewalls. An overcoat layer may also be formed between the microlens layers.

DETAILED DESCRIPTION

Figure 1:
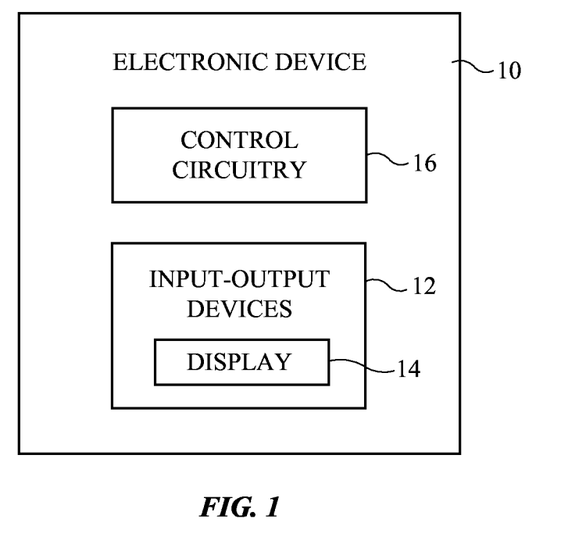
FIG. 1 is a schematic diagram of an illustrative electronic device having a display in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an audio device (e.g., a speaker), an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Figure 2:
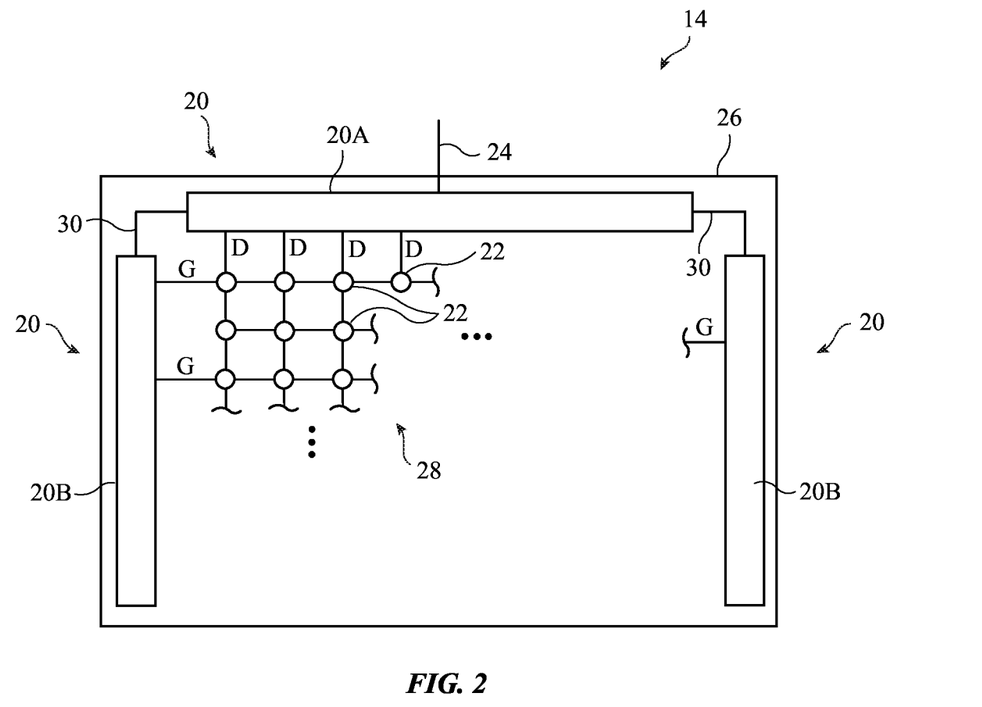
FIG. 2 is a schematic diagram of an illustrative display in accordance with an embodiment.

FIG. 2 is a diagram of an illustrative display 14. As shown in FIG. 2, display 14 may include layers such as substrate layer 26. Substrate layers such as layer 26 may be formed from rectangular planar layers of material or layers of material with other shapes (e.g., circular shapes or other shapes with one or more curved and/or straight edges). The substrate layers of display 14 may include glass layers, polymer layers, silicon layers, composite films that include polymer and inorganic materials, metallic foils, etc.

Display 14 may have an array of pixels 22 for displaying images for a user such as pixel array 28. Pixels 22 in array 28 may be arranged in rows and columns. The edges of array 28 may be straight or curved (i.e., each row of pixels 22 and/or each column of pixels 22 in array 28 may have the same length or may have a different length). There may be any suitable number of rows and columns in array 28 (e.g., ten or more, one hundred or more, or one thousand or more, etc.). Display 14 may include pixels 22 of different colors. As an example, display 14 may include red pixels, green pixels, and blue pixels. Pixels of other colors such as cyan, magenta, and yellow might also be used.

Display driver circuitry 20 may be used to control the operation of pixels 28. Display driver circuitry 20 may be formed from integrated circuits, thin-film transistor circuits, and/or other suitable circuitry. Illustrative display driver circuitry 20 of FIG. 2 includes display driver circuitry 20A and additional display driver circuitry such as gate driver circuitry 20B. Gate driver circuitry 20B may be formed along one or more edges of display 14. For example, gate driver circuitry 20B may be arranged along the left and right sides of display 14 as shown in FIG. 2.

As shown in FIG. 2, display driver circuitry 20A (e.g., one or more display driver integrated circuits, thin-film transistor circuitry, etc.) may contain communications circuitry for communicating with system control circuitry over signal path 24. Path 24 may be formed from traces on a flexible printed circuit or other cable. The control circuitry may be located on one or more printed circuits in electronic device 10. During operation, control circuitry (e.g., control circuitry 16 of FIG. 1) may supply circuitry such as a display driver integrated circuit in circuitry 20 with image data for images to be displayed on display 14. Display driver circuitry 20A of FIG. 2 is located at the top of display 14. This is merely illustrative. Display driver circuitry 20A may be located at both the top and bottom of display 14 or in other portions of device 10.

To display the images on pixels 22, display driver circuitry 20A may supply corresponding image data to data lines D while issuing control signals to supporting display driver circuitry such as gate driver circuitry 20B over signal paths 30. With the illustrative arrangement of FIG. 2, data lines D run vertically through display 14 and are associated with respective columns of pixels 22.

Gate driver circuitry 20B (sometimes referred to as gate line driver circuitry or horizontal control signal circuitry) may be implemented using one or more integrated circuits and/or may be implemented using thin-film transistor circuitry on substrate 26. Horizontal control lines G (sometimes referred to as gate lines, scan lines, emission control lines, etc.) run horizontally across display 14. Each gate line G is associated with a respective row of pixels 22. If desired, there may be multiple horizontal control lines such as gate lines G associated with each row of pixels. Individually controlled and/or global signal paths in display 14 may also be used to distribute other signals (e.g., power supply signals, etc.).

Gate driver circuitry 20B may assert control signals on the gate lines G in display 14. For example, gate driver circuitry 20B may receive clock signals and other control signals from circuitry 20A on paths 30 and may, in response to the received signals, assert a gate line signal on gate lines G in sequence, starting with the gate line signal G in the first row of pixels 22 in array 28. As each gate line is asserted, data from data lines D may be loaded into a corresponding row of pixels. In this way, control circuitry such as display driver circuitry 20A and 20B may provide pixels 22 with signals that direct pixels 22 to display a desired image on display 14. Each pixel 22 may have a light-emitting diode and circuitry (e.g., thin-film circuitry on substrate 26) that responds to the control and data signals from display driver circuitry 20.

Gate driver circuitry 20B may include blocks of gate driver circuitry such as gate driver row blocks. Each gate driver row block may include circuitry such output buffers and other output driver circuitry, register circuits (e.g., registers that can be chained together to form a shift register), and signal lines, power lines, and other interconnects. Each gate driver row block may supply one or more gate signals to one or more respective gate lines in a corresponding row of the pixels of the array of pixels in the active area of display 14.

Figure 3:
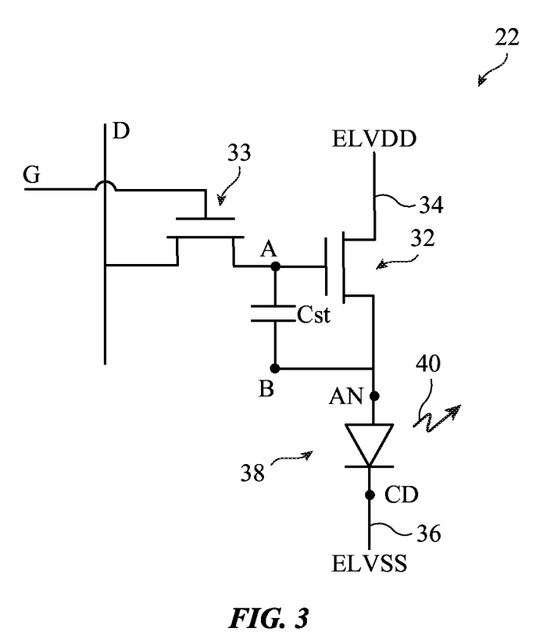
FIG. 3 is a diagram of an illustrative display pixel circuit in accordance with an embodiment.

A schematic diagram of an illustrative pixel circuit of the type that may be used for each pixel 22 in array 28 is shown in FIG. 3. As shown in FIG. 3, display pixel 22 may include light-emitting diode 38. A positive power supply voltage ELVDD may be supplied to positive power supply terminal 34 and a ground power supply voltage ELVSS may be supplied to ground power supply terminal 36. Diode 38 has an anode (terminal AN) and a cathode (terminal CD). The state of drive transistor 32 controls the amount of current flowing through diode 38 and therefore the amount of emitted light 40 from display pixel 22. Cathode CD of diode 38 is coupled to ground terminal 36, so cathode terminal CD of diode 38 may sometimes be referred to as the ground terminal for diode 38.

To ensure that transistor 38 is held in a desired state between successive frames of data, display pixel 22 may include a storage capacitor such as storage capacitor Cst. The voltage on storage capacitor Cst is applied to the gate of transistor 32 at node A to control transistor 32. Data can be loaded into storage capacitor Cst using one or more switching transistors such as switching transistor 33. When switching transistor 33 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with display pixel 22 is asserted, switching transistor 33 will be turned on and a new data signal on data line D will be loaded into storage capacitor Cst. The new signal on capacitor Cst is applied to the gate of transistor 32 at node A, thereby adjusting the state of transistor 32 and adjusting the corresponding amount of light 40 that is emitted by light-emitting diode 38. If desired, the circuitry for controlling the operation of light-emitting diodes for display pixels in display 14 (e.g., transistors, capacitors, etc. in display pixel circuits such as the display pixel circuit of FIG. 3) may be formed using other configurations (e.g., configurations that include circuitry for compensating for threshold voltage variations in drive transistor 32, etc.). The display pixel may include additional switching transistors, emission transistors in series with the drive transistor, etc. Capacitor Cst may be positioned at other desired locations within the pixel (e.g., between the source and gate of the drive transistor). The display pixel circuit of FIG. 3 is merely illustrative.

To extract light from a light-emitting diode, one or more microlenses may be incorporated over a light-emitting diode in the display. The one or more microlenses may be used to collimate light from the light-emitting diode and ensure that the light is directed vertically towards the viewer. In one embodiment, a single microlens may be formed over each light-emitting diode to extract light from that light-emitting diode. However, optimal light extraction may require the microlens to be spaced from the light-emitting diode by a large distance (undesirably increasing the thickness of the display). Therefore, each pixel may be covered by both an array of microlenses and a single microlens that is formed over the array of microlenses.

Figure 4:
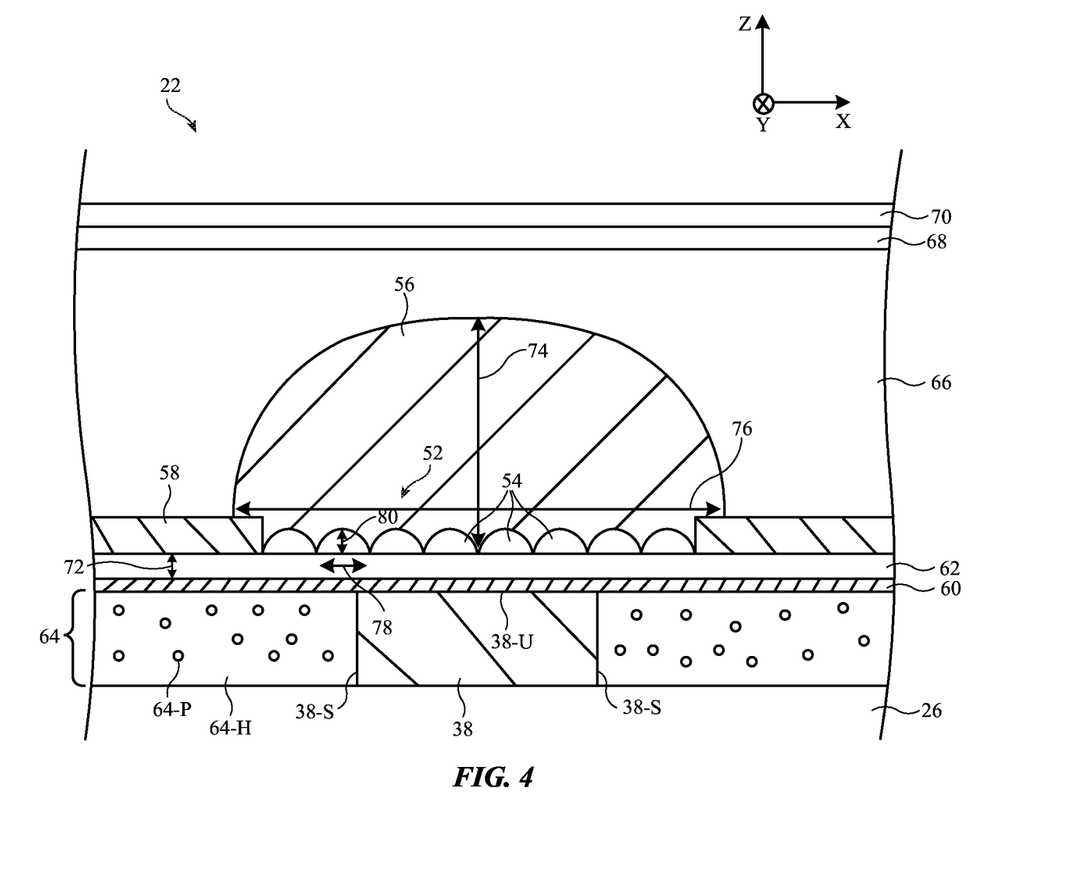
FIG. 4 is a cross-sectional side view of an illustrative display pixel that includes a light-emitting diode covered by a microlens array and an additional single microlens in accordance with an embodiment.

FIG. 4 is a cross-sectional side view of an illustrative display pixel that is covered by at least two microlenses. As shown, a light-emitting diode 38 may be formed on a substrate such as substrate 26. Substrate 26 may include glass layers, polymer layers, silicon layers, composite films that include polymer and inorganic materials, metallic foils, etc. The light-emitting diode 38 may be a micro-light-emitting diode (e.g., a light-emitting diode semiconductor die having a footprint of about 10 microns×10 microns, more than 5 microns×5 microns, less than 100 microns×100 microns, less than 20 microns×20 microns, less than 10 microns×10 microns, or other desired size). This example is merely illustrative, and light-emitting diode 38 may also be an organic light-emitting diode (OLED) that includes a plurality of OLED layers. The light-emitting diode may be electrically connected to thin-film circuitry within substrate 26. In one example, the light-emitting diode may be soldered to the substrate.

The light-emitting diode may be surrounded by diffusive layer 64. The diffusive layer 64 may be used to increase the efficiency of the display. Light-emitting diode 38 has an upper surface 38-U and sidewall surfaces 38-S. Ideally, light-emitting diode 38 would emit light from upper surface 38-U vertically (e.g., parallel to the Z-axis). However, in practice light-emitting diode 38 may emit some light from sidewalls 38-S (e.g., parallel to the X-axis). The diffusive layer 64 may recapture some of that light by redirecting light vertically.

Diffusive layer 64 (sometimes referred to as diffuser layer 64, diffuser 64, light redirecting layer 64, light scattering layer 64, etc.) includes a plurality of light scattering particles 64-P distributed throughout a host material 64-H. The host material 64-H may be a transparent polymer (e.g., a siloxane). Light scattering particles 64-P may be formed from metal oxide (e.g., titanium dioxide) or another desired material. Light scattering particles 64-P may have a different index of refraction than host material 64-H. Light incident upon the light scattering particles may be scattered in a random direction. This scattering causes some of the light to ultimately be redirected towards the viewer, increasing the efficiency of the display in comparison to embodiments where the diffusive layer is omitted (and little to no light from the LED sidewall ends up visible to the viewer).

It should be noted that a diffusive layer may additionally or instead be incorporated above lens 56 within the display (e.g., a top diffuser). For example, a diffusive layer may be formed directly on lens 56 between lens 56 and overcoat layer 66, overcoat layer 66 may itself be a diffusive layer, a diffusive layer may be formed on overcoat layer 66 between overcoat layer 66 and polarizer 68, etc. These examples are merely illustrative. In general, one or more diffusive layers may be incorporated at any desired location within the display stackup.

A cathode layer 60 may be formed over the light-emitting diode and may serve as the cathode terminal (e.g., cathode terminal CD in FIG. 3) for light-emitting diode 38. The cathode layer may serve as the cathode for multiple light-emitting diodes and is therefore formed as a blanket layer across the display. The cathode layer may be formed from a transparent conductive material (e.g., indium tin oxide).

An opaque masking layer 58 (sometimes referred to as black masking layer 58, black mask 58, opaque mask 58, etc.) is formed over the substrate 26. The opaque masking layer 58 may have an opening that overlaps light-emitting diode 38. The opening in opaque masking layer 58 over the light-emitting diode allows light from the light-emitting diode to pass through the opaque masking layer towards the viewer (e.g., in the positive Z-direction). Elsewhere (e.g., over portions of diffuser layer 64 between pixels), the opaque masking layer may block light (e.g., to prevent cross-talk between adjacent pixels). The opaque masking layer 58 may transmit less than 10% of incident light (at a wavelength associated with light emitted from LED 38), less than 5% of incident light, less than 3% of incident light, less than 1% of incident light, etc. The opaque masking layer may be formed from any desired material (e.g., an organic or inorganic opaque material).

Microlenses 54 and 56 may be included to collimate light that passes through the opening in opaque masking layer 58. Microlenses 54 and 56 may collectively be referred to as microlens stack. First, a microlens array 52 is formed in the opening in opaque masking layer 58. Microlens array 52 includes a plurality of microlenses 54 (e.g., arranged in a plurality of rows and columns, as one example). Additionally, a single microlens 56 is formed over microlens array 52. An overcoat layer 66 is formed over microlens 56. Including microlens array 52 in addition to microlens 56 allows for more collimating of light from LED 38 (e.g., by providing additional lens power) without increasing the thickness of the display.

Microlenses 54 and 56 may be formed from any desired material. Microlens 56 may be formed from an organic material such as an acrylate based material. Microlenses 54 may be formed from an inorganic material such as silicon nitride. These examples are merely illustrative. In general, both microlenses 54 and 56 may be formed from any desired organic or inorganic material.

There may be a difference in index of refraction between microlenses 54 and 56. The index of refraction difference between microlenses 54 and 56 may be greater than 0.05, greater than 0.1, greater than 0.2, greater than 0.25, greater than 0.3, greater than 0.4, less than 0.4, between 0.2 and 0.4, or any other desired magnitude. Microlenses 54 may have an index of refraction that is greater than 1.5, greater than 1.7, greater than 1.8, greater than 1.9, between 1.8 and 2.2, between 1.9 and 2.1, or any other desired magnitude. Microlens 56 may have an index of refraction that is greater than 1.3, greater than 1.4, greater than 1.5, greater than 1.6, greater than 1.7, less than 1.8, less than 1.9, between 1.5 and 1.9, between 1.6 and 1.8, or any other desired magnitude. In one example, microlenses 54 are formed from an inorganic material (a silicon nitride) having an index of refraction of 2.0 and microlens 56 is formed from an organic material (an acrylate based material) having an index of refraction of 1.69.

Microlens 56 may conform to (and directly contact) the upper surfaces of microlenses 54. Microlens 56 is in turn covered by overcoat layer 66, with overcoat layer 66 conforming to (and directly contacting) the surface of microlens 56. Overcoat layer 66 may have a lower index of refraction than microlens 56 and therefore may sometimes be referred to as a low-index overcoat layer, a low-index layer, etc. Overcoat layer 66 may be formed from an acrylate based organic material or an epoxy based organic material. These examples are merely illustrative and in general any desired organic or inorganic material may be used for low-index overcoat layer 66. The difference in refractive index between microlens 56 and overcoat layer 66 may be greater than 0.05, greater than 0.1, greater than 0.2, greater than 0.25, greater than 0.3, greater than 0.4, less than 0.4, between 0.2 and 0.4, or any other desired magnitude. Overcoat layer 66 may have an index of refraction that is greater than 1.2, greater than 1.3, greater than 1.4, greater than 1.5, between 1.2 and 1.6, between 1.3 and 1.5, or any other desired magnitude. In one example, overcoat layer 66 is formed from an epoxy based material having an index of refraction of 1.44.

Additional layers may be formed over low-index overcoat 66. As shown in FIG. 4, a polarizer 68 and transparent cover layer 70 may be formed over the low-index overcoat layer. Polarizer 68 may be a linear polarizer or a circular polarizer. Transparent cover layer 70 may be a transparent layer (e.g., formed from glass or plastic) that protects the display. One or more additional layers may be included in the display if desired (e.g., between overcoat layer 66 and transparent cover layer 70 or above transparent cover layer 70).

As shown in FIG. 4, in some configurations, a layer 62 may be interposed between light-emitting diode 38 and microlenses 54. Layer 62 (sometimes referred to as transparent layer 62, low-index layer 62, low-index overcoat layer 62, overcoat layer 62, etc.) may be formed from an organic material (e.g., an epoxy based or acrylate based material) or an inorganic material (e.g., silicon dioxide). Layer 62 may have a transparency that is greater than 80%, greater than 90%, greater than 95%, greater than 99%, or any other desired transparency. Low-index layer 62 may offer numerous performance advantages for the display. First, the presence of low-index layer 62 increases the distance between microlenses 54 and 56 and light-emitting diode 38 (due to the thickness 72 of layer 62). This increased distance results in microlenses 54 and 56 having increased lens power, resulting in light from LED 38 being better collimated. The specific thickness 72 of layer 62 may be selected to optimize the microlens performance. Thickness 72 may be less than 3 microns, less than 2 microns, less than 1.5 microns, less than 1 micron, greater than 1 micron, greater than 0.5 micron, between 1 and 3 microns, between 1 and 2 microns, or any other desired magnitude.

The difference in refractive index between microlens 56 and overcoat layer 62 may be greater than 0.05, greater than 0.1, greater than 0.2, greater than 0.25, greater than 0.3, greater than 0.4, less than 0.4, between 0.2 and 0.4, or any other desired magnitude. The difference in refractive index between microlenses 54 and overcoat layer 62 may be greater than 0.1, greater than 0.2, greater than 0.4, greater than 0.5, greater than 0.6, less than 0.7, between 0.5 and 0.7, or any other desired magnitude. Overcoat layer 62 may have an index of refraction that is greater than 1.2, greater than 1.3, greater than 1.4, greater than 1.5, between 1.2 and 1.6, less than 1.6, less than 1.5, between 1.3 and 1.5, or any other desired magnitude.

In addition to increasing spacing between the microlenses and the LED, overcoat layer 62 may improve light recycling (and therefore efficiency) in the display. When overcoat layer 62 has a low index of refraction, more light will be recycled (due to a smaller escape cone caused by the low index of refraction). This example is merely illustrative. In another possible embodiment, overcoat 62 may be formed from the same material as microlenses 54 or another material having a higher refractive index. In this type of embodiment (where the index of refraction is high in layer 62), there may be less recycling efficiency improvements but still improved lens power due to the additional separation provided by thickness 72.

Each microlens may have any desired dimensions. Microlens 56 may have a height (sometimes referred to as thickness) 74 that is greater than 3 microns, greater than 4 microns, greater than 5 microns, greater than 10 microns, greater than 15 microns, less than 15 microns, less than 10 microns, between 3 and 10 microns, between 4 and 6 microns, between 10 and 15 microns, or any other desired magnitude. Microlens 56 may have a width (sometimes referred to as diameter) 76 that is greater than 5 microns, greater than 10 microns, greater than 15 microns, greater than 20 microns, less than 20 microns, less than 15 microns, between 10 and 20 microns, between 10 and 15 microns, or any other desired magnitude. Each microlens 54 may have a height (sometimes referred to as thickness) 80 that is greater than 0.1 micron, greater than 0.3 micron, greater than 0.5 microns, greater than 1 micron, greater than 2 microns, less than 5 microns, less than 2 microns, between 0.3 and 2 microns, between 0.5 and 1 micron, or any other desired magnitude. Each microlens 54 may have a width (sometimes referred to as diameter) 78 that is greater greater than 0.5 microns, greater than 1 micron, greater than 2 microns, greater than 3 microns, greater than 5 microns, less than 5 microns, less than 3 microns, between 1 and 3 microns, or any other desired magnitude.

Figure 5:
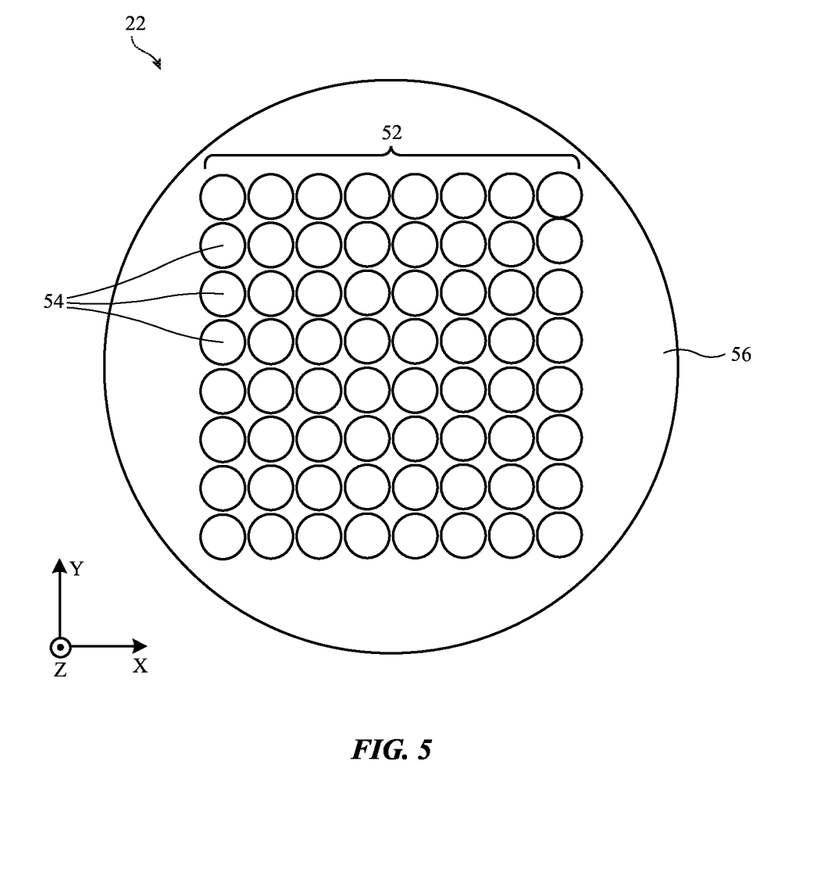
FIG. 5 is a top view of an illustrative display pixel with a microlens array and an additional single microlens such as the display pixel of FIG. 4 in accordance with an embodiment.

FIG. 5 is a top view showing an illustrative pixel with an array of microlenses covered by a single microlens such as the pixel of FIG. 4. As shown, microlenses array 52 includes a plurality of microlenses 54. The microlenses 54 in FIG. 5 are arranged in uniform rows and columns. This example is merely illustrative. The microlenses may alternatively be arranged in other (regular or irregular) patterns. For example, the footprint of the microlens array may be circular or another desired shape. A single microlens 56 is then formed over the microlens array 52. As shown, the entire microlens array 52 is overlapped by the microlens 56. Microlens 56 may conform to and contact the upper surface of every microlens in microlens array 52. Microlenses 54 in array 52 are coplanar.

Figure 6:
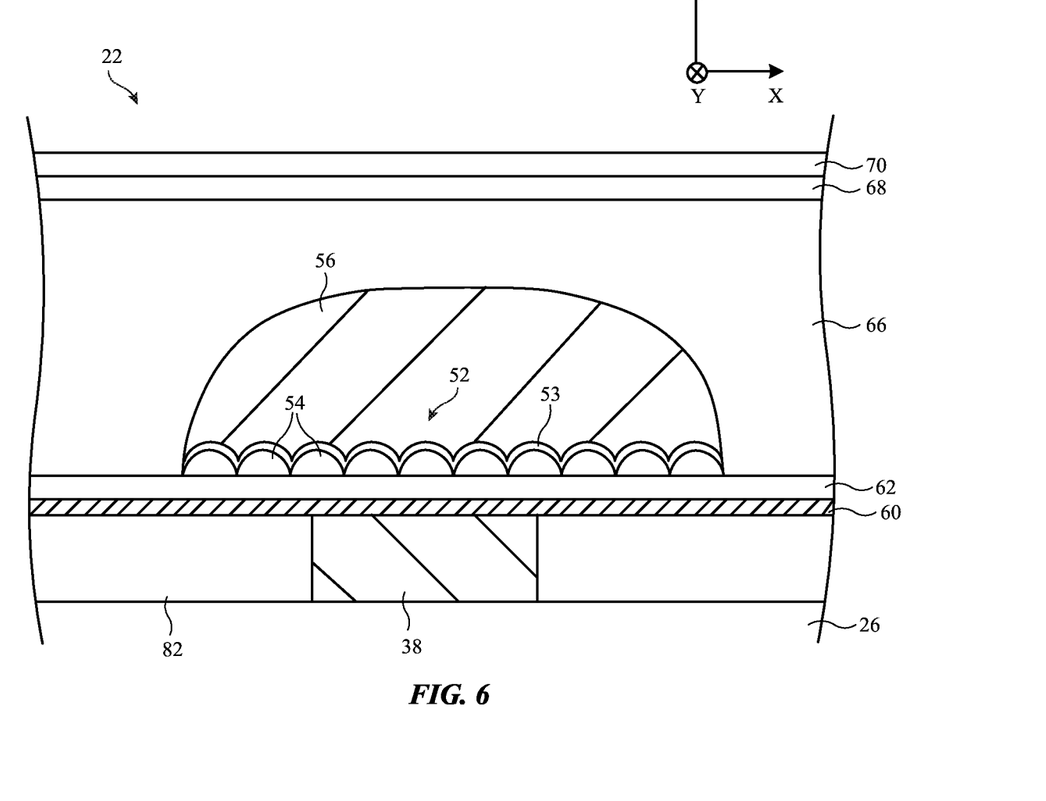
FIG. 6 is a cross-sectional side view of an illustrative display pixel that includes a light-emitting diode covered by a microlens array and an additional single microlens and that does not include an opaque masking layer in accordance with an embodiment.

The example in FIG. 4 of LED 38 being laterally surrounded (e.g., surrounded on all sides within the XY-plane) by diffusive layer 64 is merely illustrative. FIG. 6 shows an alternate configuration where light-emitting diode 38 is laterally surrounded by layer 82. In some cases, layer 82 may be an optically clear passivation layer formed from a transparent polymer. In this case, layer 82 may have a transparency greater than 80%, transparency greater than 90%, transparency greater than 95%, transparency greater than 99%, etc. Alternatively, layer 82 may be an opaque layer (e.g., a black masking layer, black mask, opaque mask, etc.) that blocks incident light. In this case, layer 82 may have a transparency less than 20%, transparency less than 10%, transparency less than 5%, transparency less than 1%, etc. FIG. 6 also shows how opaque masking layer 58 from FIG. 4 may optionally be omitted.

A passivation layer (sometimes referred to as an overcoat layer) 53 may optionally be included between each adjacent microlens layer if desired. The passivation layer may have any desired refractive index (e.g., greater than 1.2, greater than 1.3, greater than 1.4, greater than 1.5, greater than 1.6, greater than 1.7, greater than 1.8, greater than 1.9, between 1.8 and 2.2, between 1.9 and 2.1, less than 1.8, less than 1.9, between 1.5 and 1.9, between 1.6 and 1.8, between 1.2 and 1.6, between 1.3 and 1.5, etc.). This example is merely illustrative. In general, a passivation layer may optionally be included on the upper and/or lower surface of each microlens layer (e.g., in direct contact with the upper and/or lower surface of each microlens layer). The passivation layer 53 in FIG. 6 conforms to the upper surface of the microlenses 54 of microlens array 52. The lower surface of microlens 56 in turn conforms to the upper surface of passivation layer 53.

The opaque masking layer arrangements depicted thus far (e.g., in FIGS. 4 and 6) are merely illustrative. In addition to simply being included (as in FIG. 4) or omitted (as in FIG. 6), the opaque masking layer may have different footprints in embodiments where the opaque masking layer is included in the pixel.

Figure 7:
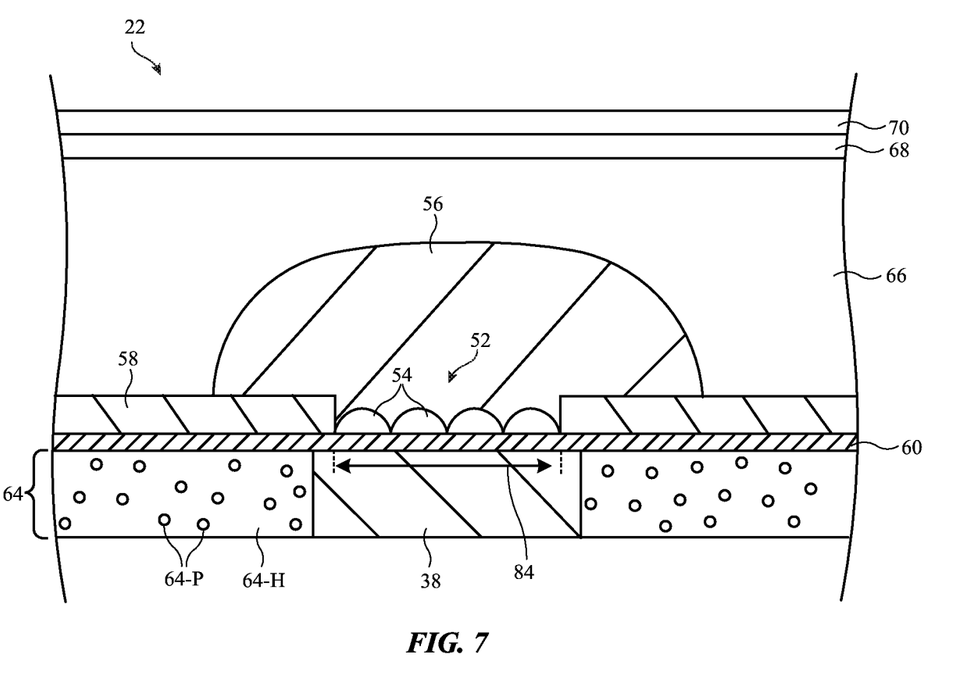
FIG. 7 is a cross-sectional side view of an illustrative display pixel that includes a light-emitting diode covered by a microlens array and an additional single microlens that has a greater width than the microlens array in accordance with an embodiment.

As shown in FIG. 7, the footprint of microlens array 52 may have a width 84. In FIGS. 4 and 6, the width 84 of array 52 is approximately equal to the width of microlens 56. In other words, width 84 may be within 15%, within 10%, within 5%, or within 1% of the width of microlens 56 (width 76 in FIG. 4). In contrast, in FIG. 7 width 84 differs from the width of microlens 56 by a greater amount (e.g., more than 20%, more than 40%, more than 60%, etc.). Said another way, the width of microlens 56 may be greater than array width 84 by a factor of 1.5 or more, 2.0 or more, between 1.3 and 2.5, etc.

In FIGS. 4 and 7, opaque masking layer 58 defines an opening that is entirely occupied by microlens array 52. In other words, there is no gap between microlenses 54 and opaque masking layer 58. This example is merely illustrative. If desired, there may be a gap between the opaque masking layer 58 and the edges of microlens array 52. In FIG. 7, microlens 56 vertically overlaps and directly contacts a portion of opaque masking layer 58 in addition to the entire microlens array 52. FIG. 7 also shows how low-index overcoat 62 between LED 38 and microlens array 52 may optionally be omitted.

Figure 8:
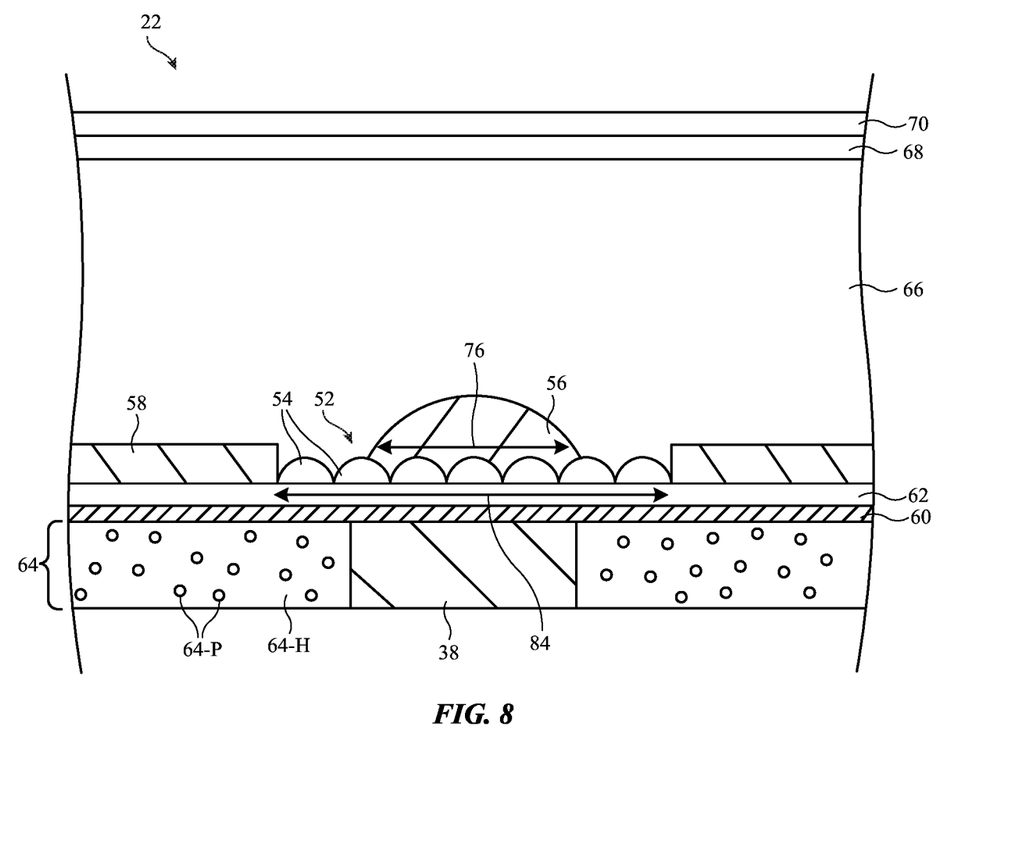
FIG. 8 is a cross-sectional side view of an illustrative display pixel that includes a light-emitting diode covered by a microlens array and an additional single microlens that has a smaller width than the microlens array in accordance with an embodiment.

FIG. 8 shows an alternative arrangement where the width 84 of microlens array 52 is greater than the width 76 of microlens 56. In this case, microlens array 52 is partially covered by microlens 56 (instead of completely covered as in FIGS. 4, 6, and 7). Microlens 56 is still the only microlens formed over array 52 in this embodiment. In FIG. 7, width 84 may differ from width 76 by more than 20%, more than 40%, more than 60%, etc. Said another way, the width 84 may be greater than width 76 by a factor of 1.5 or more, 2.0 or more, between 1.3 and 2.5, etc.

In FIGS. 4 and 6-8, an example is depicted where a larger single microlens is formed over a plurality of smaller microlenses. This example is merely illustrative. If desired, the position of the microlenses may be switched (e.g., with an array of smaller microlenses formed over a larger microlens). In general, two or more layers of microlenses may be included with each microlens layer including one or more microlenses of any desired size.

In FIGS. 4 and 6-8, microlenses 54 of array 52 are depicted as having curved upper surfaces. An arrangement of this type is shown in detail in FIG. 9A. As shown, each microlens has a curved upper surface 90. Each curved upper surface may have a uniform radius of curvature or a non-uniform radius of curvature. The width, height, center-to-center spacing between microlenses (pitch), radius of curvature, and contact angle (e.g., the angle at which the curved upper surface of a given microlens meets a curved upper surface of an adjacent microlens) of the microlenses may be tuned to optimize the display performance.

Figure 9A:
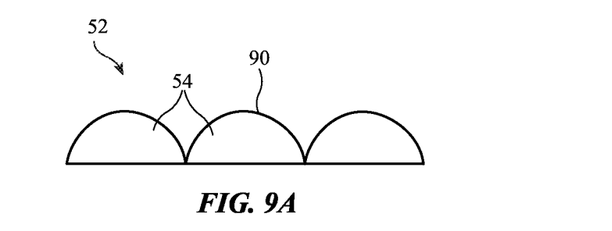
FIGS. 9A-9D are cross-sectional side views of illustrative microlens arrays showing different possible shapes for the microlenses in accordance with an embodiment.
Figure 9B:
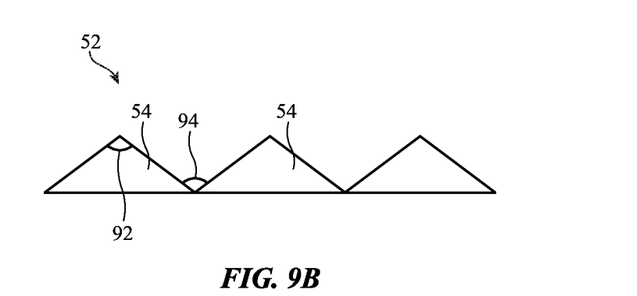

The example of FIG. 9A is merely illustrative. In general, each microlens 54 may have any desired shape. As shown in FIG. 9B, each microlens 54 (sometimes referred to as a light focusing feature 54) may have a triangular cross-sectional shape (e.g., associated with a pyramidal shape, triangular prism shape, etc.). Each microlens may have surfaces that meet at an angle 92 and may be at an angle 94 relative to adjacent microlenses. The width, height, center-to-center spacing between microlenses, angle 92, and angle 94 of the microlenses may be tuned to optimize the display performance. In the example of FIG. 9B, each microlens has an isosceles triangular cross-section. This example is merely illustrative. If desired, the microlens may have any other type of triangular cross-sectional shape.

Figure 9C:
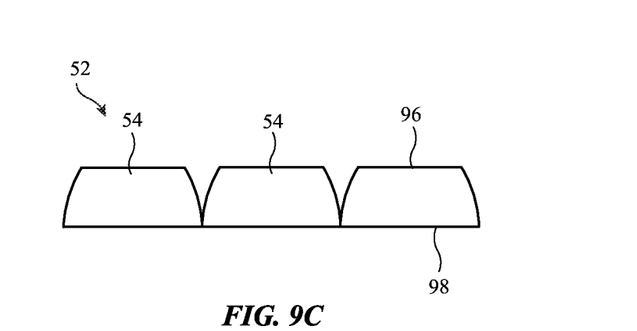

FIG. 9C shows another example of a microlens shape that may be used in the pixels 22. In FIG. 9C, each microlens has a planar upper surface 96 that is parallel to lower surface 98. This may be referred to as a pillar-shaped microlens. The width of upper surface 96, the width of lower surface 98, the center-to-center spacing between microlenses, the height of the microlens, and the contact angle between adjacent microlenses may be tuned to optimize the display performance.

Figure 9D:
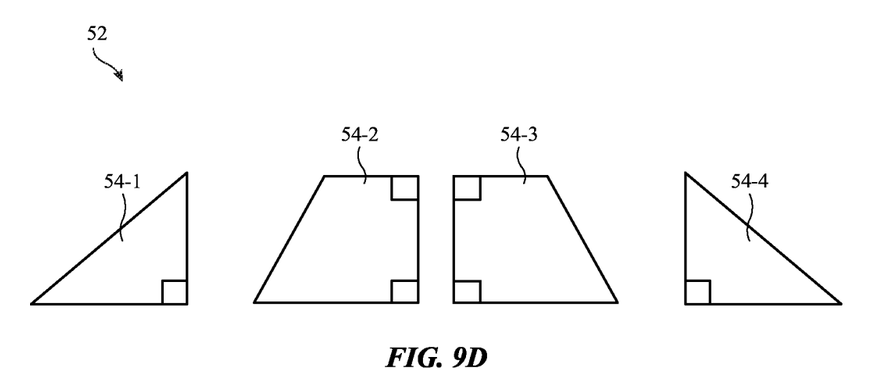

Another possible arrangement for microlens array 52 is shown in FIG. 9D. FIG. 9D shows an example where microlenses having different cross-sectional shapes are incorporated in a single display. As shown, microlenses 54-1 and 54-4 may have cross-sectional shapes that are right triangles. These cross-sectional shapes may be symmetric about a vertical axis. Additionally, microlens array 52 includes microlenses 54-2 and 54-3 that have cross-sectional shapes that are right trapezoids (trapezoids that have at least two right angles). The cross sectional shapes of microlenses 54-2 and 54-3 may also be symmetric about a vertical axis (e.g., the same vertical axis as microlenses 54-1 and 54-4).

The microlens shapes shown in FIGS. 9A-9D (or any other desired microlens shape) may be used in any of the aforementioned embodiments if desired. Each pixel in the display may be covered by one or more microlenses as shown in any of FIGS. 4 and 6-8. The microlens arrangement for each pixel may be the same across the display or different pixels may have different microlens arrangements. The features of FIGS. 4 and 6-8 may be used in any combination. For example, any pixel may optionally include or omit low-index layer 62, may use a diffusive layer, opaque layer, or transparent polymer around LED 38, may optionally include or omit the opaque masking layer 58, may have stacked microlenses of any desired widths and heights, may include microlenses and overcoats formed from any desired materials, may include an overcoat layer between microlens layers, etc. Similarly, any of these combinations may use microlenses 54 of any shape (e.g., as in FIG. 9A, 9B, 9C, or 9D).

In one illustrative example, the microlens stack over each pixel may be optimized based on the wavelength of light emitted by each pixel. Consider an example where the display includes red, blue, and green light-emitting diodes. Instead of all of the pixels in the display having the same microlens stack, each color of LED may be covered by the same microlens stack. In this case, all of the red pixels would have the same, first microlens stack, all of the green pixels would have the same, second microlens stack, and all of the blue pixels would have the same, third microlens stack. In another example, two colors may use the same stack and a third color may use a different stack. For example, all of the blue and green pixels may have the same, first microlens stack, and all of the red pixels may have the same, second microlens stack.

Additionally, herein examples are shown of at least two stacked microlenses layers. In other possible arrangements, three microlens layers or more than three microlens layers may be included in the microlens stack for additional lens power. In these types of arrangements, three or more microlens may be vertically overlapping.

The foregoing is merely illustrative and various modifications can be made by those skilled in the art without departing from the scope and spirit of the described embodiments. The foregoing embodiments may be implemented individually or in any combination.

What is claimed is:

1. A display comprising:
   a substrate;
   a light-emitting diode formed on the substrate;
   a microlens array that is formed over the light-emitting diode, wherein the microlens array comprises a plurality of first microlenses, wherein each one of the first microlenses is formed from a first material having a first index of refraction, wherein the first material is an inorganic material, and wherein the microlens array has a first width; and
   a second microlens that conforms to and covers the microlens array, wherein the second microlens is formed from a second material having a second index of refraction, wherein the second material is an organic material, wherein the second index of refraction is less than the first index of refraction and wherein the second microlens has a second width that is greater than the first width.

2. The display defined in claim 1, wherein each one of the first microlenses has a third width that is less than the second width and a first height and wherein the second microlens has a second height that is greater than the first height.

3. The display defined in claim 1, wherein a difference between the first index of refraction and the second index of refraction is greater than 0.2.

4. The display defined in claim 3, further comprising:
   a low-index layer that is interposed between the light-emitting diode and the microlens array, wherein the low-index layer has a third index of refraction that is less than the second index of refraction and the first index of refraction.

5. The display defined in claim 4, wherein a difference between the third index of refraction and the first index of refraction is greater than 0.5.

6. The display defined in claim 3, further comprising:
   an overcoat layer that is formed over and conforms to the second microlens, wherein the overcoat layer has a third index of refraction that is less than the second index of refraction and the first index of refraction.

7. The display defined in claim 6, wherein a difference between the third index of refraction and the second index of refraction is greater than 0.2.

8. The display defined in claim 1, further comprising:
   a diffusive layer that is formed adjacent to sidewalls of the light-emitting diode.

9. The display defined in claim 8, further comprising:
   an opaque masking layer that is formed over the substrate, wherein the microlens array is formed in an opening in the opaque masking layer.

10. The display defined in claim 1, further comprising:
    an opaque masking layer that is formed over the substrate, wherein the microlens array is formed in an opening in the opaque masking layer;
    a layer of indium tin oxide that forms a portion of the light-emitting diode; and
    an overcoat layer that is interposed between the layer of indium tin oxide and the microlens array, wherein the overcoat layer is interposed between the layer of indium tin oxide and the opaque masking layer.

11. The display defined in claim 1, wherein the second width is greater than the first width by a factor that is greater than 1.5.

12. The display defined in claim 1, wherein each one of the first microlenses has a curved upper surface.

13. The display defined in claim 1, wherein each one of the first microlenses has a triangular cross-sectional shape.

14. The display defined in claim 1, wherein each one of the first microlenses has a pillar cross-sectional shape with parallel upper and lower surfaces.

15. The display defined in claim 1, further comprising:
    an overcoat layer that is interposed between the microlens array and the second microlens.

16. A display comprising:
    a substrate;
    a light-emitting diode formed on the substrate;
    a diffusive layer that is formed adjacent to sidewalls of the light-emitting diode, wherein the diffusive layer comprises light scattering particles that are distributed throughout a transparent polymer material;
    a microlens array that is formed over the light-emitting diode, wherein the microlens array comprises a plurality of first microlenses and wherein the microlens array has a first width; and
    a second microlens that conforms to and covers the microlens array, wherein the second microlens has a second width that is greater than the first width.

17. A display comprising:

a substrate;

a light-emitting diode formed on the substrate;

a microlens array that is formed over the light-emitting diode, wherein the microlens array comprises a plurality of first microlenses and wherein the microlens array has a first width;

a second microlens that conforms to and covers the microlens array, wherein the second microlens has a second width that is greater than the first width; and an opaque masking layer that is formed over the substrate, wherein the microlens array is formed in an opening in the opaque masking layer and wherein the opaque masking layer is formed above and in direct contact with a layer of indium tin oxide that forms a portion of the light-emitting diode.

18. A display comprising:

a substrate;

a light-emitting diode formed on the substrate;

a plurality of coplanar microlenses formed from an inorganic material, wherein the inorganic material has a first index of refraction that is greater than 1.9 and wherein the light-emitting diode is at least partially overlapped by the plurality of coplanar microlenses; and an additional microlens formed from an organic material, wherein the organic material has a second index of refraction that is less than 1.8 and wherein the additional microlens covers all of the plurality of coplanar microlenses.

19. The display defined in claim 18, further comprising:

an overcoat layer that covers the additional microlens and that has a third index of refraction that is less than 1.5, wherein the second index of refraction is greater than 1.6.

20. A display comprising:

a substrate;

a light-emitting diode formed on the substrate;

a transparent layer that is formed over the light-emitting diode;

an array of microlenses that is formed over the transparent layer, wherein the transparent layer is interposed between the light-emitting diode and the array of microlenses; and an additional microlens that overlaps the light-emitting diode, wherein the array of microlenses is interposed between the transparent layer and the additional microlens, and wherein the additional microlens has a first index of refraction that is lower than a second index of refraction of the array of microlenses and greater than a third index of refraction of the transparent layer.

21. The display defined in claim 20, wherein the display further comprises a cathode layer and wherein the cathode layer is interposed between the substrate and the transparent layer.

* * * * *